United States Patent
Hayashi et al.

(10) Patent No.: US 10,157,961 B2
(45) Date of Patent: Dec. 18, 2018

(54) METHOD OF MANUFACTURING MAGNETORESISTIVE ELEMENT

(71) Applicant: CANON ANELVA CORPORATION, Kawasaki-shi (JP)

(72) Inventors: Marie Hayashi, Kawasaki (JP); Kiyotaka Sakamoto, Kawasaki (JP); Masayoshi Ikeda, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 15/595,103

(22) Filed: May 15, 2017

(65) Prior Publication Data
US 2017/0250221 A1 Aug. 31, 2017

Related U.S. Application Data

(60) Division of application No. 15/075,409, filed on Mar. 21, 2016, which is a continuation of application No. PCT/JP2014/002210, filed on Apr. 18, 2014.

(30) Foreign Application Priority Data

Sep. 25, 2013 (JP) ................................ 2013-197982

(51) Int. Cl.
*H01L 27/00* (2006.01)
*H01L 27/22* (2006.01)
(Continued)

(52) U.S. Cl.
CPC .......... *H01L 27/228* (2013.01); *G11C 11/161* (2013.01); *G11C 11/1673* (2013.01);
(Continued)

(58) Field of Classification Search
CPC ....... G01L 27/228; G01L 43/08; G01L 43/12; G11C 11/161; G11C 11/1673;
(Continued)

(56) References Cited

U.S. PATENT DOCUMENTS 7,659,209 B2   2/2010   Sakamoto et al.
7,977,243 B2   7/2011   Sakamoto et al.
(Continued)

FOREIGN PATENT DOCUMENTS

JP         4-254328 A     9/1992
JP    2009-302550 A    12/2009
(Continued)

OTHER PUBLICATIONS

International Search Report in International Application No. PCT/JP2014/002210 (dated Jul. 22, 2014).
(Continued)

*Primary Examiner* — Nicole Ippolito
*Assistant Examiner* — Hanway Chang
(74) *Attorney, Agent, or Firm* — Venable LLP

(57) ABSTRACT

Provided are a method of manufacturing a magnetoresistive element and a manufacturing system which are capable of manufacturing a magnetoresistive element achieving further downscaling, i.e., further increase in the degree of integration of the magnetoresistive element while having high magnetic properties. The method includes: preparing a stacked film including one of the two magnetic layers, a layer to form the tunnel barrier layer, and the other of the two magnetic layers, on a substrate; forming multiple separated stacked films on the substrate by separating the stacked film into the multiple stacked films by etching; irradiating side portions of the multiple separated stacked films with ion beams in a pressure-reducible process chamber; and after the irradiation with the ion beams, forming oxide layers or nitride layers on surfaces of the multiple stacked films by introducing an oxidizing gas or a nitriding gas into the process chamber.

12 Claims, 10 Drawing Sheets

(51) Int. Cl.
  *H01L 43/02* (2006.01)
  *H01L 43/10* (2006.01)
  *H01L 43/08* (2006.01)
  *H01L 43/12* (2006.01)
  *G11C 11/16* (2006.01)

(52) U.S. Cl.
  CPC .......... *G11C 11/1675* (2013.01); *H01L 43/02* (2013.01); *H01L 43/08* (2013.01); *H01L 43/10* (2013.01); *H01L 43/12* (2013.01)

(58) Field of Classification Search
  CPC ... G11C 11/1675; H01L 27/228; H01L 43/08; H01L 43/12
  USPC .............................. 250/492.2, 492.22, 492.3
  See application file for complete search history.

(56) References Cited

U.S. PATENT DOCUMENTS

| | | | |
|---|---|---|---|
| 8,119,018 B2 | 2/2012 | Ikemoto et al. |
| 8,339,841 B2 | 12/2012 | Iwayama |
| 8,472,149 B2 | 6/2013 | Hara et al. |
| 8,540,852 B2 | 9/2013 | Watanabe et al. |
| 8,871,645 B2 | 10/2014 | Ganguly et al. |
| 8,970,213 B2 | 3/2015 | Toyosato et al. |
| 2003/0091739 A1 | 5/2003 | Sakamoto et al. |
| 2006/0054593 A1 | 3/2006 | Sakamoto et al. |
| 2007/0087577 A1 | 4/2007 | Sakamoto et al. |
| 2007/0117363 A1 | 5/2007 | Sakamoto et al. |
| 2007/0141274 A1 | 6/2007 | Sakamoto et al. |
| 2008/0272302 A1 | 11/2008 | Frey et al. |
| 2009/0189083 A1 | 7/2009 | Godyak |
| 2010/0047471 A1 | 2/2010 | Sakamoto et al. |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2014/0170778 A1 | 6/2014 | Ikeda |
| 2015/0102396 A1 | 4/2015 | Ganguly et al. |

FOREIGN PATENT DOCUMENTS

| | | |
|---|---|---|
| JP | 2010-186869 A | 8/2010 |
| KR | 2003-0040061 A | 5/2003 |
| TW | 2007-17470 A | 5/2007 |
| TW | 2012-3351 A | 1/2012 |
| WO | 2007/032379 A1 | 3/2007 |
| WO | 2015/045205 A1 | 4/2015 |

OTHER PUBLICATIONS

Office Action in Taiwanese Application No. 103129887 (dated Nov. 20, 2015).
International Preliminary Report on Patentability in International Application No. PCT/JP2014/002210 (dated Mar. 29, 2016).
Notice of Preliminary Rejection in Korean Application No. 10-2016-7008946 (dated Nov. 27, 2017).

METHOD OF MANUFACTURING MAGNETORESISTIVE ELEMENT

CROSS-REFERENCES TO RELATED APPLICATIONS

This application is a divisional application of U.S. patent application Ser. No. 15/075,409, filed Mar. 21, 2016, which is a continuation application of International Application No. PCT/JP2014/002210, filed Apr. 18, 2014, which claims the benefit of Japanese Patent Application No. 2013-197982 filed Sep. 25, 2013. The contents of the aforementioned applications are incorporated herein by reference in their entireties.

TECHNICAL FIELD

The present invention relates to a method of manufacturing a magnetoresistive element, and a manufacturing system for the same.

BACKGROUND ART

A magnetic random access memory (MRAM) is a nonvolatile memory including tunneling magnetoresistive (TMR) elements utilizing tunneling magnetoresistive effect. The MRAM has been drawing attention as a revolutionary next-generation memory which makes it possible to rewrite data without limitation while achieving as high integration density as the dynamic random access memory (DRAM) and as high speed as the static random access memory (SRAM).

The TMR elements are arranged at intersections of word lines and bit lines to be used to read and write signals, for example. The TMR element is used as a memory cell in which an underlayer being the lowermost layer and a cap layer being the uppermost layer are processed to be a lower electrode and an upper electrode, respectively, and are then connected to wiring to play roles as the electrodes.

When an electric current flows vertically from the lower electrode to the upper electrode in the TMR element, the TMR element freely changes the magnetic direction of a magnetization free layer as a ferromagnetic layer, and thereby switches the electric resistance value of the electric current flowing into the an insulating layer between the high and low levels. With the low resistant state and the high resistant state of each TMR element set to "0" and "1," respectively, the MRAM performs information reading and writing by exchanging the information with the metal wiring.

As a method of manufacturing a magnetoresistive element applicable to the MRAM and the like, Patent Document 1 discloses the invention intended to solve damage caused on a multilayer magnetic film in the processing of the multilayer magnetic film by reactive ion beam etching.

In the invention disclosed in Patent Document 1, a damage layer formed on the multilayer magnetic film in the processing by the reactive ion beam etching is removed with ion beam irradiation. Patent Document 1 discloses that a protection film (made of aluminum nitride or the like) is formed on the clean surface of the magnetic film obtained by removing the damage layer.

CITATION LIST

Patent Document

Patent Document 1: International Publication No. WO 2007/032379

SUMMARY OF INVENTION

The invention disclosed in Patent Document 1 is intended to enhance the magnetic properties by removing the damage layer and thereby to improve the yield, and therefore has made tremendously great contribution to this technical field.

Today, however, a degree of downscaling to be achieved in the manufacturing of MRAMs, for example, is greatly different from that in 2007 when Patent Document 1 was disclosed. Nowadays, the manufacturing of MRAMs is required to achieve a degree of integration about 16 times higher than that in 2007, and the technique disclosed in Patent Document 1 is not necessarily sufficient to meet such requirements in reality.

As a result of studies, the present inventors have found the knowledge that new adhesion of deposits (adhered substances) onto processed pieces of a multilayer magnetic film after ion beam irradiation until protection layer formation may act as an obstacle to achievement of both the downscaling and the magnetic properties required in these years.

It is an objective of the present invention to provide a method of manufacturing a magnetoresistive element and a manufacturing system for the same which are capable of manufacturing a magnetoresistive element achieving further downscaling, i.e., further increase in the degree of integration of the magnetoresistive element while having high magnetic properties.

A method of manufacturing a magnetoresistive element provided according to an aspect of the present invention is a method of manufacturing a magnetoresistive element in which a tunnel barrier layer is provided between two magnetic layers, the method comprising the steps of: preparing a stacked film on a substrate, the stacked film including one of the two magnetic layers, a layer to form the tunnel barrier layer, and the other of the two magnetic layers; forming a plurality of separated stacked films on the substrate by separating the stacked film into the plurality of stacked films by etching; irradiating side portions of the plurality of separated stacked films with ion beams in a pressure-reducible process chamber; and after the irradiation with the ion beams, forming oxide layers or nitride layers on surfaces of the plurality of stacked films by introducing an oxidizing gas or a nitriding gas into the process chamber.

In addition, a manufacturing system for a magnetoresistive element provided according to another aspect of the present invention is a manufacturing system for a magnetoresistive element in which a tunnel barrier layer is provided between two magnetic layers, the system comprising: an etching apparatus including an etching chamber and configured to separate a stacked film, which includes one of the two magnetic layers, a layer to form the tunnel barrier layer, and the other of the two magnetic layers, on a substrate into a plurality of stacked films by etching inside the etching chamber, and thereby to form the plurality of separated stacked films on the substrate; and an ion beam irradiation apparatus including a pressure-reducible process chamber connected to the etching chamber via a substrate transfer chamber, and configured to irradiate side portions of the plurality of separated stacked films with ion beams in the process chamber, wherein the ion beam irradiation apparatus includes a gas introduction system configured to introduce an oxidizing gas or a nitriding gas into the process chamber after the irradiation with the ion beams.

According to the present invention, it is possible to manufacture a magnetoresistive element achieving further downscaling, i.e., further increase in the degree of integration of the magnetoresistive element while having high magnetic properties.

DESCRIPTION OF EMBODIMENTS

Hereinafter, an embodiment of the present invention is described with reference to the drawings. It should be noted that the present invention is not limited to the embodiment described herein, but may be modified as necessary without departing from the spirit of the present invention.

Figure 1:
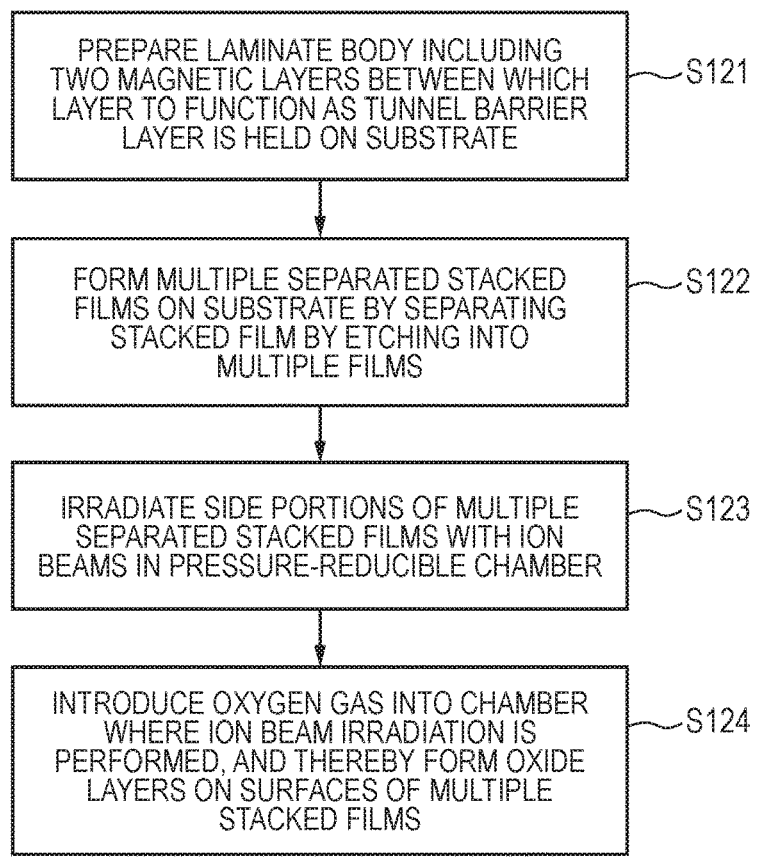
FIG. 1 is a flowchart for explaining a method of manufacturing a magnetoresistive element according to an embodiment of the present invention.

FIG. 1 presents steps to be executed in a method of manufacturing a magnetoresistive element according to this embodiment. Note that this embodiment is described for a case of manufacturing a tunneling magnetoresistive (TMR) element as a magnetoresistive element. The method of manufacturing a magnetoresistive element according to this embodiment includes steps S121, S122, S123, and S124 which are executed sequentially in this order as presented in FIG. 1.

Step S121 is a step of preparing a stacked film formed on a substrate, the stacked film including two magnetic layers between which a layer to function as a tunnel barrier layer is held.

In general, step S121 is the step of obtaining the stacked film including a magnetization free layer, an insulating layer, and a magnetization pinned layer in such a way that after the forming of an electrode layer and others on the substrate, magnetic layers to function as the magnetization free layer and the magnetization pinned layer, and the insulating layer to function as the tunnel barrier layer are stacked. The substrate on which the stacked film is formed is a substrate made of, for example, silicon, glass, or the like, and used as a substrate for TMR element formation. This step S121 can be executed by using a known technique. For example, various kinds of film deposition techniques such as a sputtering technique and chemical vapor deposition technique (CVD technique) are usable to form the magnetization free layer, the insulating layer, and the magnetization pinned layer.

Step S122 is a step of forming multiple separated stacked films on the substrate by separating by etching the stacked film obtained in step S121 into the multiple stacked films.

This step S122 is the step of processing the stacked film (body) into multiple individual separated stacked films by performing generally-employed processes including: forming a hard mask layer on the stacked film; applying a photoresist; patterning the photoresist; and performing dry etching. The multiple separated stacked films each function as a TMR element.

As the dry etching in this step S122, reactive ion etching, or ion beam irradiation used in step S123 to be described next can be used. Step S122 can be executed inside an etching chamber of an etching apparatus capable of performing such dry etching.

Step S123 is a step of performing a trimming process in such a way that mainly side portions (side wall portions) of the multiple separated stacked films on the substrate obtained in step S122 are irradiated with ion beams inside a pressure-reducible chamber. This trimming process is to remove damage layers, deposits (adhered substances) and the like generated on the side portions (side wall portions) of the stacked films by the dry etching in step S122. The damage layers and the like to be removed by the trimming process include a damage layer due to oxidation, and deposits such as water, organic substances, and inorganic substances unintentionally adhered to and deposited on the side portions (side wall portions) of the stacked films. Such deposits are, for example, etching residues, and reaction products of the etching residues with a gas such as the etching gas.

This step S123 may employ an ion beam etching apparatus configured to extract, as beams, ions released by plasma generation, and to irradiate a work piece with the beams. The generation of plasma to extract ions as beams may use an inert gas such as an argon (Ar) gas, a krypton (Kr) gas, or a xenon (Xe) gas. Use of the inert gas to generate the plasma for ion beam irradiation makes it possible to reduce reaction of the ion beams with the materials of the stacked films, and thereby to obtain the clean surfaces of the stacked films.

Step S124 is a step of forming oxide layers on the surfaces of the multiple stacked films by introducing an oxygen ($O_2$) gas into the pressure-reducible chamber where the ion beam irradiation is performed in step S123. In this embodiment, the pressure-reducible chamber to which the oxygen gas is introduced preferably has a base pressure of $1.3 \times 10^{-3}$ Pa or lower. Here, the oxygen gas may be introduced alone, or may be introduced as a mixture with another gas such as an argon gas or a nitrogen ($N_2$) gas. Instead, the oxygen gas may be introduced into the chamber together with the inert gas used to generate the plasma in step S123 described above. When the partial pressure of the oxygen gas is adjusted by introducing the oxygen gas and another gas together as described above, the layer thickness of the oxide layers formed on the surfaces of the stacked films can be controlled easily. In addition, if the inert gas used to generate the plasm in step S123 described above is introduced together with the oxygen gas, there is no need to provide an additional gas introduction system.

This step S124 is the most distinctive step in this embodiment. Step S124 is to perform the oxidation process using the oxygen gas inside the same chamber as the chamber where the ion beam irradiation in step S123 is performed. As compared with the case of the oxidation process or the like performed in a different chamber, the oxidation process performed in the same chamber can suppress contamination on the surfaces of the stacked films that may occur due to adsorption of adherent molecules (such as $H_2$, $H_2O$, and C) or due to other causes during the transfer to the different chamber. Thus, according to this embodiment, it is possible to achieve the further downscaling of a magnetoresistive element, and also to improve the magnetic properties of the magnetoresistive element. It should be noted that the introduction of the oxygen gas into the chamber in which the ion beam irradiation is just performed can be performed in succession to the ion beam irradiation, that is, after the ion beam irradiation without opening the gate valve or the like serving as a gateway for loading/unloading a substrate to/from the chamber. This ensures that contamination of the surfaces of the stacked films can be suppressed.

After step S124, a protection layer (protection film) may be formed on the oxide layers thus formed. The formation of a further protection layer on the oxide layers formed on the surfaces kept from adsorbing the adherent molecules may offer a sufficient protection function. As the protection layer thus formed, a nitride film is preferable, and more specifically a silicon nitride film (SiN film) can be cited. In addition, an aluminum nitride film (AlN film), a silicon oxynitride film (SiON film), or the like can be also cited as other specific examples of the protection film. Then, a film deposition method for the protection layer is not particularly limited, but may use the CVD technique, the sputtering technique, or the like.

Figure 2A:
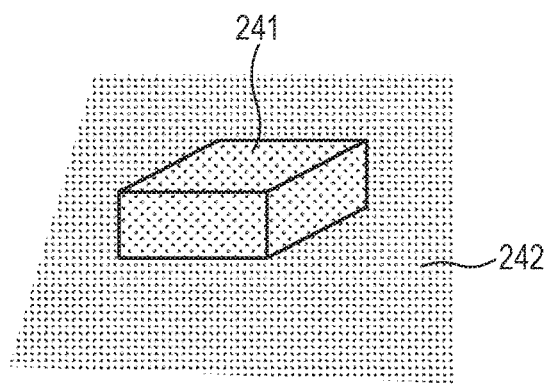
FIG. 2A is a schematic view (No. 1) for explaining a magnetoresistive element obtained by the method of manufacturing a magnetoresistive element according to the embodiment of the present invention.
Figure 2B:
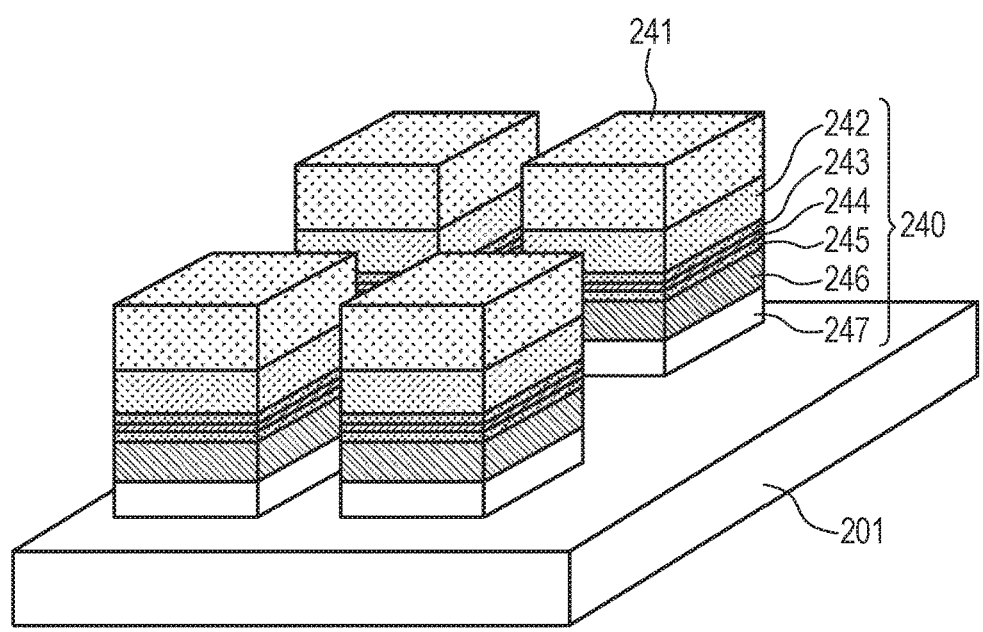
FIG. 2B is a schematic view (No. 2) for explaining magnetoresistive elements obtained by the method of manufacturing a magnetoresistive element according to the embodiment of the present invention.

FIGS. 2A and 2B schematically illustrate general outline views of TMR elements manufactured by the method of manufacturing a magnetoresistive element according to this embodiment in states before and after processing.

In general, the manufacturing of TMR elements is conducted in processes including a step of processing a magnetoresistive film deposited on a substrate by an etching process such as ion beam etching (IBE), reactive ion etching (RIE), or reactive ion beam etching.

FIG. 2A illustrates the general outline view of TMR elements before processing, whereas FIG. 2B illustrates the general outline view of TMR elements after the processing.

In FIG. 2A, 241 indicates a photoresist or hard mask, and 242 indicates an upper electrode. Here, under the upper electrode 242, a magnetization free layer, a tunnel barrier layer, a magnetization pinned layer, an antiferromagnetic layer, and a lower electrode, which are described later, are stacked on the substrate in this order from the upper electrode 242 side to the substrate side.

The upper electrode 242 and the layers thereunder are processed by using the photoresist or hard mask 241 processed in a desired pattern.

In FIG. 2B, 201 indicates the substrate, and 240 indicates TMR elements. Here, an oxide layer (oxide film) is formed on the outside of each TMR element 240 in an ordinary case, but the oxide layer is omitted herein in order to facilitate the understanding of the lamination structure.

FIG. 2B illustrates a bottom pin structure in which the magnetization pinned layer is located at the bottom position. The TMR element 240 includes an upper electrode 242, a magnetization free layer 243, a tunnel barrier layer 244, and a magnetization pinned layer 245, an antiferromagnetic layer 246, and a lower electrode 247, which form a base structure.

As a material for constituting the upper electrode 242 and the lower electrode 247, Ta, Ru, Ti, or the like is preferably used. As materials for constituting the magnetization free layer 243 and the magnetization pinned layer 245, used are materials each having a structure including a single layer or a laminate structure including two or more layers, the layers each made of a material containing an alloy of CoFeB, or an alloy of at least one or more of Co, Fe, Ni, and the like. As a material for constituting the tunnel barrier layer 244, aluminum oxide ($Al_2O_3$) or magnesium oxide (MgO) is preferable. Besides them, any of oxides containing at least one or more of Mg, Al, Ti, Zn, Hf, Ge, and Si may be used. As a material for constituting the antiferromagnetic layer 246, PtMn, IrMn, or the like is used.

Here, in the TMR element 240, the tunnel barrier layer 244 is held between the magnetization pinned layer 245 and the magnetization free layer 243, which are two ferromagnetic layers. Thus, the magnetization pinned layer 245 can be regarded as one of the magnetic layers, and magnetization free layer 243 can be regarded as the other of the magnetic layers.

In this embodiment, the TMR element is described by using what is termed as a bottom pin structure in which the magnetization pinned layer is located under the tunnel barrier layer. However, the structure of the TMR element should not be limited in particular. Indeed, the present invention can be also used preferably in the case where the structure of the TMR element is what is termed as a top pin structure in which the magnetization pinned layer is located on top of the tunnel barrier layer.

Figure 3:
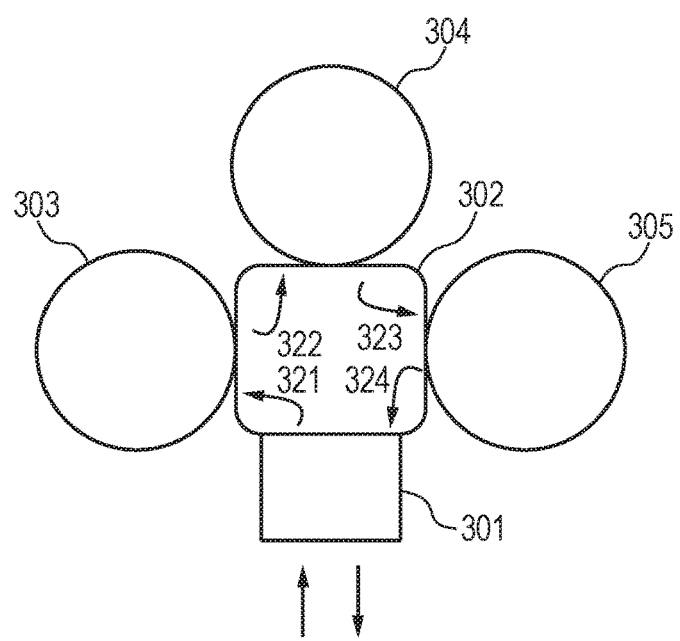
FIG. 3 is a schematic view for explaining a manufacturing system preferable to implement the method of manufacturing a magnetoresistive element according to the embodiment of the present invention.

FIG. 3 schematically illustrates an example of a manufacturing system preferable to implement the method of manufacturing a magnetoresistive element according to this embodiment. The manufacturing system includes an etching chamber 303, a process chamber 304, and a protection layer formation chamber 305 as chambers where to execute the foregoing steps. In addition, the manufacturing system includes a vacuum transfer chamber 302 as a substrate transfer chamber, and a wafer loader 301.

In FIG. 3, the etching chamber 303 is a chamber where to perform the etching of step S122 presented in FIG. 1. The etching chamber 303 is a chamber in which reactive ion etching can be performed in general.

The process chamber 304 is a chamber where to perform the ion beam irradiation of step S123 and the oxide layer formation of step S124 presented in FIG. 1. The process chamber 304 is provided with means capable of introducing an oxygen gas into the process chamber 304, and means capable of ion beam etching inside the process chamber 304.

The protection layer formation chamber 305 is a chamber where to perform a process of forming a protection layer (protection film) as needed on the oxide layers formed in the process chamber 304.

The etching chamber 303, the process chamber 304, and the protection layer formation chamber 305 are installed with the vacuum transfer chamber 302 via shutter means (not illustrated) such as gate valves in such a manner that the chambers 303, 304, and 305 can individually communicate with the vacuum transfer chamber 302.

Each of the vacuum transfer chamber 302, the etching chamber 303, the process chamber 304 where to perform the ion beam irradiation and the oxidation process, and the protection layer formation chamber 305 may be a pressure-reducible chamber.

The wafer loader 301 is further installed with the vacuum transfer chamber 302. Through the wafer loader 301, elements before processing can be loaded to the vacuum transfer chamber 302 and the elements after completion of the processing can be unloaded. Here, the elements before the processing are in the form of a stacked film formed on a substrate and including two magnetic layers between which a layer to function as a tunnel barrier layer is held. The elements before the processing are prepared by a deposition apparatus such as a sputtering apparatus to execute step S121 presented in FIG. 1. The deposition apparatus that prepares the elements before the processing may be separate from and independent of the manufacturing system illustrated in FIG. 3, or may be incorporated in the manufacturing system illustrated in FIG. 3. In the latter case, a deposition chamber where the deposition apparatus to execute step S121 is to perform deposition is installed with the vacuum transfer chamber 302 in a manner capable of communicating with the vacuum transfer chamber 302 via shutter means such as a gate valve.

The vacuum transfer chamber 302 is provided therein with substrate transfer means not illustrated, and is capable of transferring loaded elements before the processing to the chambers one after another as illustrated by arrows 321, 322, 323, 324. The transfer of the elements before the processing as illustrated by the arrows 321, 322, 323, 324 in FIG. 3 can be carried out consistently under a vacuum condition (condition under reduced pressure) via the vacuum transfer chamber 302 without breaking the vacuum.

Figure 4:
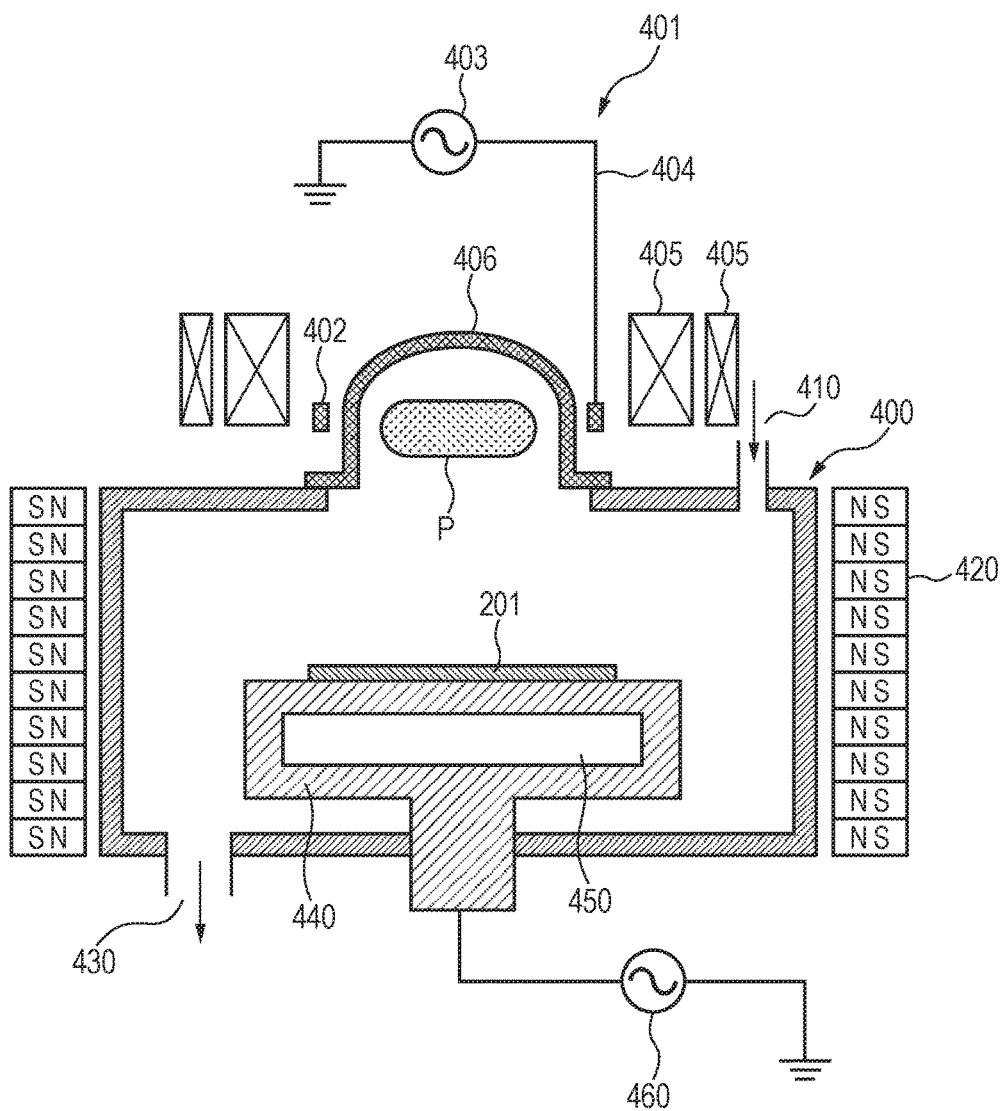
FIG. 4 is a schematic view for explaining a processing apparatus applicable to etching in the method of manufacturing a magnetoresistive element according to the embodiment of the present invention.

FIG. 4 is a schematic view of a reactive ion etching apparatus employable as a processing apparatus applicable to the etching of this embodiment.

The etching apparatus illustrated in FIG. 4 includes a vacuum container 400 and a dielectric wall container 406 connected to the vacuum container 400 in such an air-tight manner that the inner space thereof communicates with the vacuum container 400. Note that the vacuum container 400 is equivalent to the foregoing etching chamber 303 illustrated in FIG. 3.

The inside of the vacuum container 400 is evacuated by an evacuation system 430. A substrate 201 is loaded into the vacuum container 400 via a gate valve not illustrated. The substrate 201 loaded in the vacuum container 400 is held by a substrate holder 440. The substrate 201 is one on which a stacked film is formed, the stacked film including a layer to function as a tunnel barrier layer, and two magnetic layers between which that layer is held.

The substrate holder 440 is capable of being maintained at a predetermined temperature by a temperature control mechanism 450. A bias power source 460 to apply a bias voltage to the substrate 201 is connected to the substrate holder 440.

In addition, a gas introduction system 410 to introduce an etching gas into the vacuum container 400 is connected to the vacuum container 400. As the etching gas, various kinds of etching gases which are not particularly limited can be used. For example, as the etching gas, an alcohol gas containing at least one or more hydroxyl groups such as a methanol ($CH_3OH$) gas may be used.

A large number of side wall magnets 420 are arranged side by side outside the side wall of the vacuum container 400. The side wall magnets 420 form cusp fields along inner surfaces of the side wall of the vacuum container 400. The cusp fields prevent plasma from being diffused to the inner surface of the side wall of the vacuum container 400.

Moreover, the dielectric wall container 406 is provided with a plasma source to form plasma P inside the dielectric wall container 406. The plasma source includes an antenna 402 to generate an induction field inside the dielectric wall container 406, a high frequency power source 403 connected to the antenna 402 by way of a transmission line 404 via a matching box not illustrated, and electromagnets 405. The antenna 402 is arranged to surround the dielectric wall container 406. The electromagnets 405 are arranged to surround the dielectric wall container 406 and the antenna 402.

Using this etching apparatus, the etching process is carried out in the following way.

First, the gas introduction system 410 is driven to introduce the etching gas at a predetermined flow rate into the vacuum container 400 via a pipe, a valve, and a flow rate regulator from a gas cylinder in which the etching gas is stored. The introduced etching gas is diffused in the inside of the dielectric wall container 406 via the inside of the vacuum container 400.

Next, the plasma source is driven to form plasma P. When the plasma source is driven, the electromagnets 405 generate a predetermined magnetic field inside the dielectric wall container 406. The high frequency power source 403 generates high frequency power (source power) to be supplied to the antenna 402. With application of the high frequency generated by the high frequency power source 403 for plasma, the electric current flows through the antenna 402, and the plasma P is formed inside the dielectric wall container 406.

The plasma P thus formed is diffused to the inside of the vacuum container 400 from the dielectric wall container 406, and reaches around the surface of the substrate 201, so that the surface of the substrate 201 is etched.

To be more specific, the photoresist or hard mask patterned, for example, in a memory pattern form is formed on the laminated films constituting the magnetoresistive film arranged on the substrate 201. The laminated films are etched by the plasma P by using the photoresist or hard mask as a mask. In this way, multiple stacked films separated from each other are formed on the substrate 201.

Here, during this process, the bias power source 460 may be driven to apply a self-bias voltage, which is a negative direct voltage, to the substrate 201, and thereby to control incidence energy of ions from the plasma incident onto the surface of the substrate 201.

Figure 5:
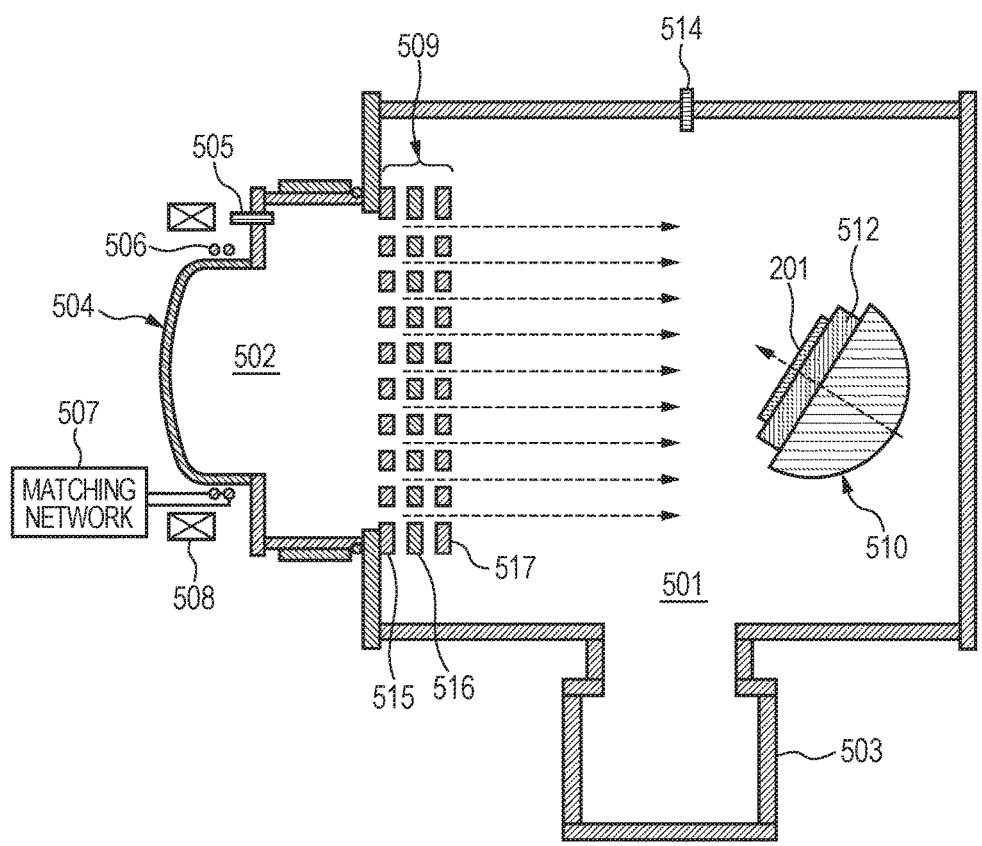
FIG. 5 is a schematic view for explaining a processing apparatus applicable to ion beam irradiation and an oxidation process in the method of manufacturing a magnetoresistive element according to the embodiment of the present invention.

FIG. 5 is a schematic view illustrating a processing apparatus capable of performing an ion beam irradiation process and oxide layer formation by an oxidation process.

The processing apparatus illustrated in FIG. 5 is an ion beam etching apparatus (ion beam irradiation apparatus), and includes a process chamber 501 and a plasma generation chamber 502. A vacuum pump 503 is connected to the process chamber 501. In the process chamber 501, both the etching process by ion beam etching and the oxidation process by oxygen gas introduction can be performed as described later. Note that the process chamber 501 is equivalent to the aforementioned process chamber 304 illustrated in FIG. 3.

The plasma generation chamber 502 is provided with a bell jar 504, a first gas inlet 505, an RF antenna 506, a matching box 507, and an electromagnetic coil 508. An extraction electrode (grid) 509 is provided at a boundary between the plasma generation chamber 502 and the process chamber 501. The extraction electrode 509 includes three electrodes 515, 516, 517. The three electrodes 515, 516, 517 are plate-shaped electrodes each having openings formed in a grid pattern, and are arranged in parallel to each other.

In the process chamber 501, a substrate holder 510 is provided which includes an ESC electrode 512 on the plasma generation chamber 502 side of the substrate holder 510. The substrate 201 to be processed is placed on the ESC electrode 512 and is held on the ESC electrode 512 by electrostatic chucking.

In the plasma generation chamber 502, an etching gas is introduced from the first gas inlet 505, and a high frequency is applied to the RF antenna 506, so that plasma of the etching gas can be generated inside the plasma generation chamber 502. Here, the etching gas introduced from the first gas inlet 505 is not particularly limited, but an inert gas such as an argon gas, for example, may be used as the etching gas.

Then, with application of a direct voltage to the extraction electrode 509, the ions inside the plasma generation chamber 502 are extracted as beams, and the substrate 201 is irradiated with the ion beams thus extracted. In this way, the substrate 201 is processed. The extracted ion beams are electrically neutralized by a neutralizer not illustrated. Then, the substrate 201 is irradiated with the neutralized ion beams, and thus is prevented from causing charge-up.

The substrate holder 510 is capable of tilting at an arbitrary angle to the ion beams. The substrate holder 510 has a structure capable of rotating the substrate 201 in its in-plane direction (rotating the substrate 201 on its own axis). By use of such a substrate holder 510, the side wall portions of the multiple stacked films formed on the substrate 201 can be irradiated with the ion beams at a predetermined incident angle, and also the entire surface of the substrate 201 can be evenly irradiated with the ion beams, as described later.

In addition, the process chamber 501 is provided with a second gas inlet 514, and an oxygen gas for the oxidation process can be introduced as a process gas from the second gas inlet 514 into the process chamber 501. The oxygen gas may be also introduced to the process chamber 501 via the plasma generation chamber 502 from the first gas inlet 505 as similar to the second gas inlet 514. The oxygen gas introduced from the second gas inlet 514 or the first gas inlet 505 may be an oxygen gas alone, or may be mixed with another gas such as an argon gas or a nitride gas.

When the laminated films constituting the magnetoresistive film on the substrate 201 are etched to form multiple stacked films by using the reactive ion etching apparatus illustrated in FIG. 4, damage layers and the like may be generated on the side wall portions of the multiple stacked films. The ion beam etching apparatus illustrated in FIG. 5 is capable of performing a trimming process of the damage layers and the like generated on the side wall portions of the multiple stacked films. This trimming process removes the damage layers due to oxidation, and deposits such as water, organic substances, inorganic substances and the like adhered to and deposited on the side wall portions of the stacked films.

After the above trimming process, the oxygen gas is introduced into the process chamber 501 from the second gas inlet 514 or the first gas inlet 505, and the oxidation process is performed on the stacked films having the clean side wall portions after the trimming process. Here, the oxygen gas may be introduced into the process chamber 501 from both the second gas inlet 514 and the first gas inlet 505. Thus, through the oxidation process using the oxygen gas, surface portions of the multiple stacked films are oxidized with the result that oxide layers are formed on the surfaces of the multiple stacked films.

In this embodiment, in succession to the ion beam irradiation, the oxidation process using the oxygen gas is performed inside the process chamber 501 which is the chamber in which the ion beam irradiation is performed, as described above. Hence, it is the most distinctive feature in this embodiment that, in the same chamber as the chamber in which the ion beam irradiation is performed, the oxidation process is performed without unloading the substrate to the outside of the chamber.

When the oxidation process is performed in the same chamber, the oxidation process can be performed on the clean side wall portions of the stacked films after the trimming process. In addition to this, as compared with the case of the oxidation process performed in a different chamber, it is possible to suppress the contamination that may otherwise occur due to adsorption of adherent molecules (such as $H_2$, $H_2O$, and C) or other causes during the transfer of the substrate to the different chamber.

Figure 6A:
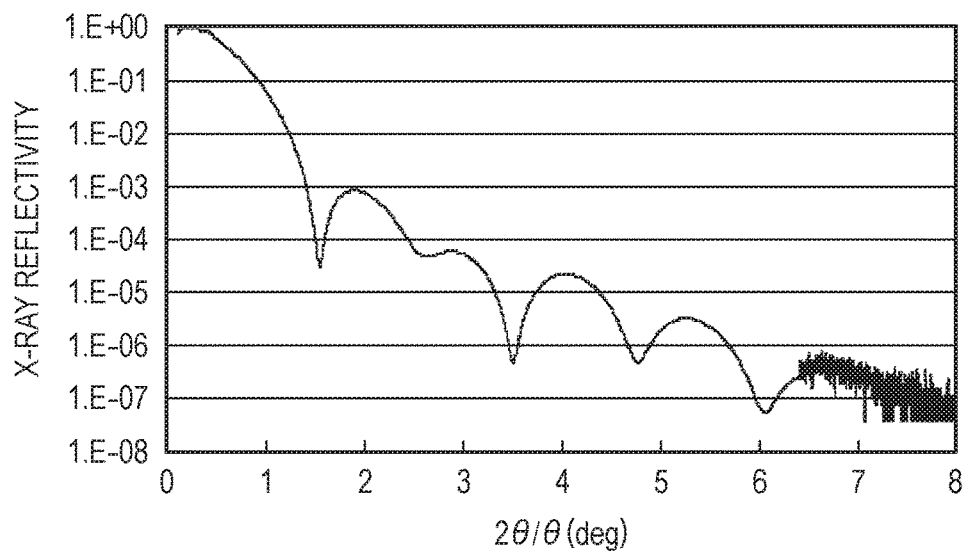
FIG. 6A is a diagram (No. 1) for explaining an effect of the method of manufacturing a magnetoresistive element according to the embodiment of the present invention.
Figure 6B:
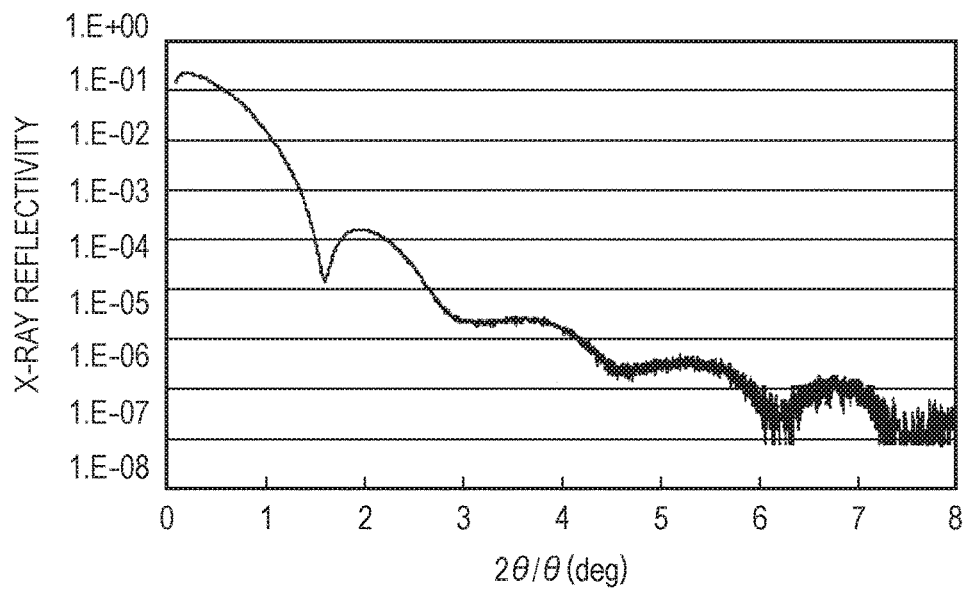
FIG. 6B is a diagram (No. 2) for explaining the effect of the method of manufacturing a magnetoresistive element according to the embodiment of the present invention.
Figure 6C:
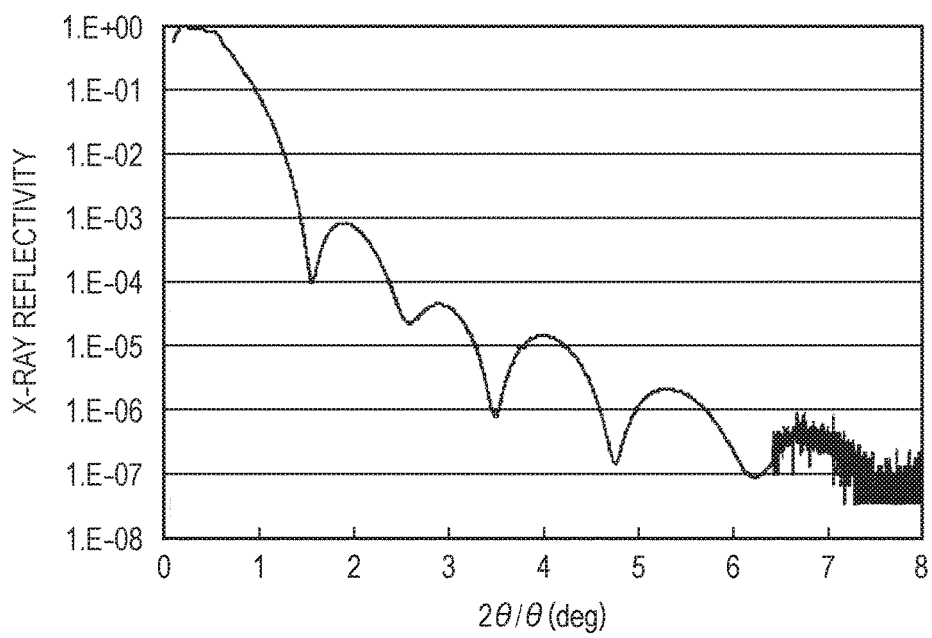
FIG. 6C is a diagram (No. 3) for explaining the effect of the method of manufacturing a magnetoresistive element according to the embodiment of the present invention.

FIGS. 6A to 6C are graphs for explaining an effect of this embodiment.

FIG. 6A depicts an analytic spectrum of X-ray reflectivity measured on an oxide film (oxide layer) obtained by oxidizing a ferrocobalt layer which is a magnetic layer used in an MRAM formed according to this embodiment. The abscissa axis indicates the angle of reflection of X-rays and the ordinate axis indicates the reflectivity of the X-rays.

Here, the oxide film was formed by performing the oxidation process for one minute by introducing the oxygen gas at a flow rate of 50 SCCM into the process chamber 304, illustrated in FIG. 3, in which both the ion beam irradiation and the oxidation process can be performed. The partial pressure of the oxygen inside the chamber 304 in this process was $1.3 \times 10^{-2}$ Pa.

As a result of analysis of the data depicted in FIG. 6A, the film thickness of the oxide film is found to be 1.65 nm.

A sample having the oxide film formed in the aforementioned way was introduced into a different chamber, waited for five minutes, and then was measured in the same measurement as the above. FIG. 6C depicts a result of this management.

The film thickness obtained from FIG. 6C is 1.79 nm, which slightly increases from the film thickness obtained from FIG. 6A. What is more important than the film thicknesses is that the waveforms of the two cases are very similar to each other. This proves that the oxide film formed previously can be maintained even after the sample is left for five minutes in the different chamber.

On the other hand, another sample which was not subjected to the oxidation process according to this embodiment was left in the aforementioned different chamber for five minutes, then returned to the former IBE chamber, and oxidized newly by the oxidation process. FIG. 6B depicts the analysis result of the sample thus prepared.

The spectrum depicted in FIG. 6B presents a waveform apparently different from those of the spectra depicted in FIGS. 6A and 6C. Then, the film thickness obtained from FIG. 6B is 1.38 nm, which is thinner.

Presumably, this is because, in the case where the oxidation process according to this embodiment was not performed, the clean surfaces bared by the IBE suffered surface contamination in the different chamber, and therefore were not oxidized well. This leads to understanding that it is important to immediately oxidize the surfaces in the same chamber where the IBE process is performed. The above results prove that the oxide layers can be favorably formed on the surfaces of the stacked films according to this embodiment, in which the IBE process and the oxidation process are performed in the same chamber. Thus, according to this embodiment, it is possible to produce an advantageous effect in which contamination of the stacked films due to the adsorption of adherent molecules or other causes can be suppressed by the oxide layers favorably formed on the surfaces of the stacked films.

In this embodiment, it is preferable to introduce the oxygen gas after completion of the plasma generation for ion beam irradiation. This ensures the successful execution of each of the ion beam irradiation process with the plasma generation and the oxidation process.

Moreover, a preferable partial pressure of the oxygen gas in the oxide layer formation is within a range of $1.0 \times 10^{-1}$ Pa to $2.0 \times 10^{-3}$ Pa. Then, a preferable process time of the oxidation process under such a partial pressure of the oxygen gas is within a range of 10 seconds to 5 minutes. These conditions are determined with consideration of design rules for downscaling and a layer thickness of oxide layers which today's MRAMs and the like are required to achieve.

Further, a preferable layer thickness of the oxide layer is within a range of 1.5 nm to 3.0 nm. Use of the oxide layers each having a layer thickness of 1.5 nm or greater ensures prevention of the contamination due to the adsorption of adherent molecules or other causes. Meanwhile, use of the oxide layers each having a layer thickness of 3.0 nm or smaller ensures high process efficiency by keeping the process time short.

Here, as a gas to be introduced into the chamber 304 after trimming the side walls of TMR elements, a nitrogen gas can be used preferably instead of the oxygen gas. Since the nitrogen reacts more gently than the oxygen, the use of the nitrogen gas is effective in the case where reaction films formed on the surfaces of TMR elements are desired to be thinner in response to further advancement of the downscaling of the TMR elements.

Hereinafter, the method of manufacturing a magnetoresistive element according to this embodiment is described in details with reference to FIGS. 7A to 7F.

First, a magnetic multilayer film is formed on a substrate 100, the magnetic multilayer film including a lower electrode layer 101, an antiferromagnetic layer 102, a magnetization pinned layer 103, a tunnel barrier layer 104, a magnetization free layer 105, and an upper electrode layer 106.

Figure 7A:
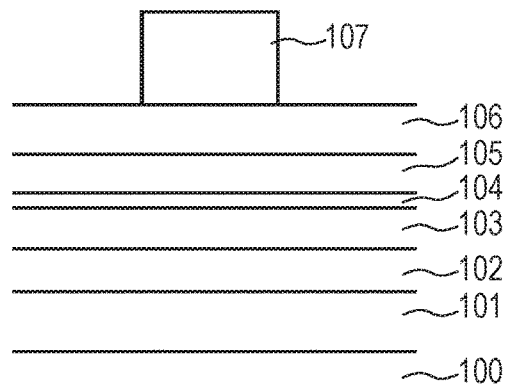
FIG. 7A is a cross sectional process chart (No. 1) for explaining the method of manufacturing a magnetoresistive element according to the embodiment of the present invention.

Note that each of the magnetization pinned layer 103 and the magnetization free layer 105 does not have to be a single layer as illustrated in FIG. 7A, or may be formed of a multiplayer film including several layers. In addition, it is also possible to reverse the positional relationship between the magnetization pinned layer 103 and the magnetization free layer 105, i.e., to exchange their upper and lower positions. More specifically, the antiferromagnetic layer 102 may be located above the tunnel barrier layer 104, a ferromagnetic layer located on top of the tunnel barrier layer 104 may be formed as a magnetization pinned layer 105, and a ferromagnetic layer located under the tunnel barrier layer 104 may be formed as a magnetization free layer 103.

Next, a photomask 107 for processing is formed on top of the aforementioned magnetic multilayer film (FIG. 7A). In this case, the photoresist is not limited to a single layer, but may be formed by using a multilayer resist process or may be formed in a lamination structure in which an antireflective film is formed as a lower layer.

Figure 7B:
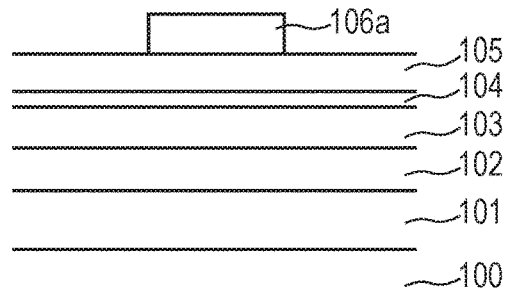
FIG. 7B is a cross sectional process chart (No. 2) for explaining the method of manufacturing a magnetoresistive element according to the embodiment of the present invention.

Subsequently, the upper electrode layer 106 is processed by using this photomask 107 with RIE technique or the like. Then, the photomask is removed by asking with oxygen gas, for example, thereby to form a metal mask layer 106a (FIG. 7B). The reactive etching in this RIE is performed by using a chlorine gas, for example, as a main ingredient. Note that the gas used for the RIE technique is not particularly limited, but an inert gas of Ar or the like may also be used.

Figure 7C:
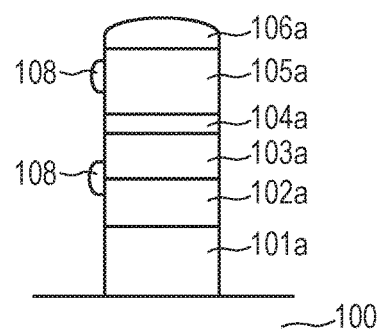
FIG. 7C is a cross sectional process chart (No. 3) for explaining the method of manufacturing a magnetoresistive element according to the embodiment of the present invention.

Thereafter, the magnetic multilayer film is processed by, for example, the RIE technique using the metal mask layer 106a as a mask, and thereby the magnetic multilayer film including the lower electrode layer 101, the antiferromagnetic layer 102, the magnetization pinned layer 103, tunnel barrier layer 104, and the magnetization free layer 105 is separated into multiple films (FIG. 7C). Thus, the multiple separated magnetic multilayer films each including the lower electrode layer 101, the antiferromagnetic layer 102, the magnetization pinned layer 103, tunnel barrier layer 104, and the magnetization free layer 105 are formed on the substrate 100. Here, by use of the manufacturing system illustrated in FIG. 3, the etching by the RIE technique using a gas containing, for example, $CH_3OH$ as a main ingredient can be performed in the etching chamber (RIE chamber) 303. Any gas, not particularly limited, may be used for the RIE technique as long as the purpose can be achieved, and a hydrocarbon gas of $CH_4$, $C_2H_4$, or the like, or an inert gas of Ar or the like may also be used.

Although the entire multilayer film is processed in FIG. 7C, the etching may employ what is termed as "Stop on Dielectric" in which only the upper electrode layer 106 and the magnetization free layer 105 are processed.

Here, all of the lower electrode layer 101 to the magnetization free layer 105 are processed by the RIE in this embodiment, but may be processed by the ion beam etching (IBE) instead of the RIE. In the case of the processing by IBE, it is preferable not to use a reactive gas, but to use only an inert gas of Ar, Xe, Kr or the like in order to inhibit chemical reaction with the magnetic material included in the TMR elements.

Deposits (adhered substances) 108 unintentionally generated adhere to the cross sections (side wall portions) of the magnetic multilayer films processed by the predetermine etching (FIG. 7C).

Figure 7D:
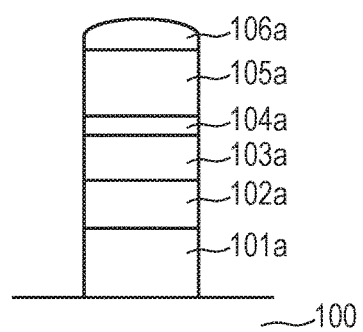
FIG. 7D is a cross sectional process chart (No. 4) for explaining the method of manufacturing a magnetoresistive element according to the embodiment of the present invention.

Then, in order to trim the deposits 108, inside the process chamber (ion beam etching chamber) 304 of the manufacturing system illustrated in FIG. 3, the side walls of the separated magnetic multilayer films on the substrate are irradiated with Ar ion beams at a predetermined angle (FIG. 7D).

Figure 8:
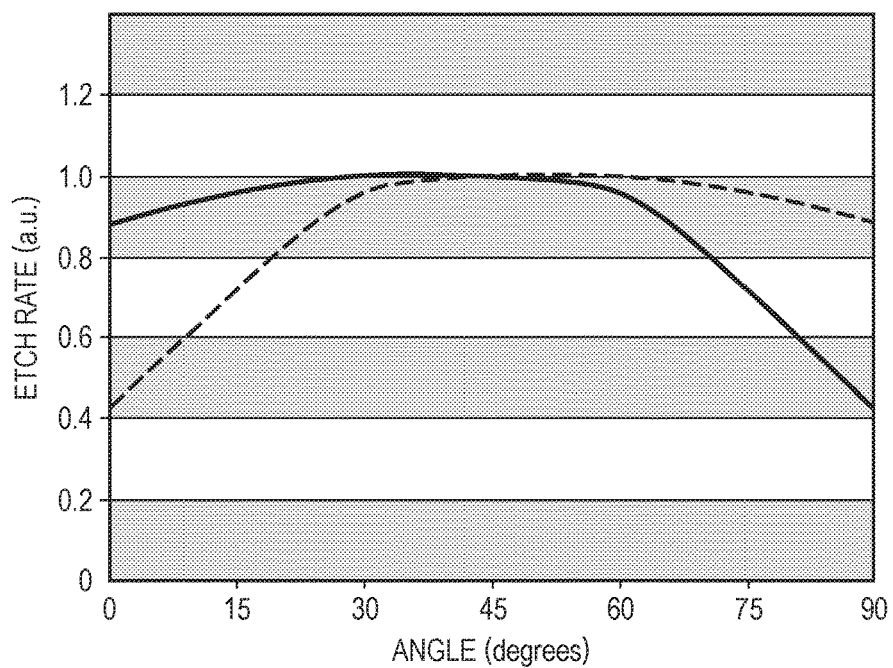
FIG. 8 is a graph (No. 1) for explaining a relationship between an etch rate and an incident angle of Ar particles.

Here, using FIG. 8, description is provided for an incident angle of Ar particles (particles of Ar ions) of the Ar ion beams to efficiently remove the deposits 108 described above.

FIG. 8 is a graph presenting a relationship between an etch rate and an incident angle of Ar particles on Ti as an example of a material to be etched. In FIG. 8, the abscissa axis indicates an incident angle of Ar particles on a substrate surface to be processed, and the ordinate axis indicates an etch rate expressed in an arbitrary unit. Here, the incident angle of Ar particles incident perpendicularly on the substrate surface to be processed is defined as 0 degrees. In FIG. 8, a solid line indicates a relationship between the etch rate and the incident angle of Ar particles on a surface in parallel to the substrate surface to be processed, and a broken line indicates a relationship between the etch rate and the incident angle of Ar particles on a surface perpendicular to the substrate surface to be processed.

From FIG. 8, it can be understood that, in the case where the Ar particles are incident perpendicularly on the surface to be processed, the etch rate on the surface in parallel to the surface to be processed is high, whereas the etch rate on the surface perpendicular to the surface to be processed is low. Then, as a tilt of the incident angle of Ar particles increases, a difference between the etch rates on the two surfaces decreases, and then the two etch rates are reversed eventually.

Figure 9:
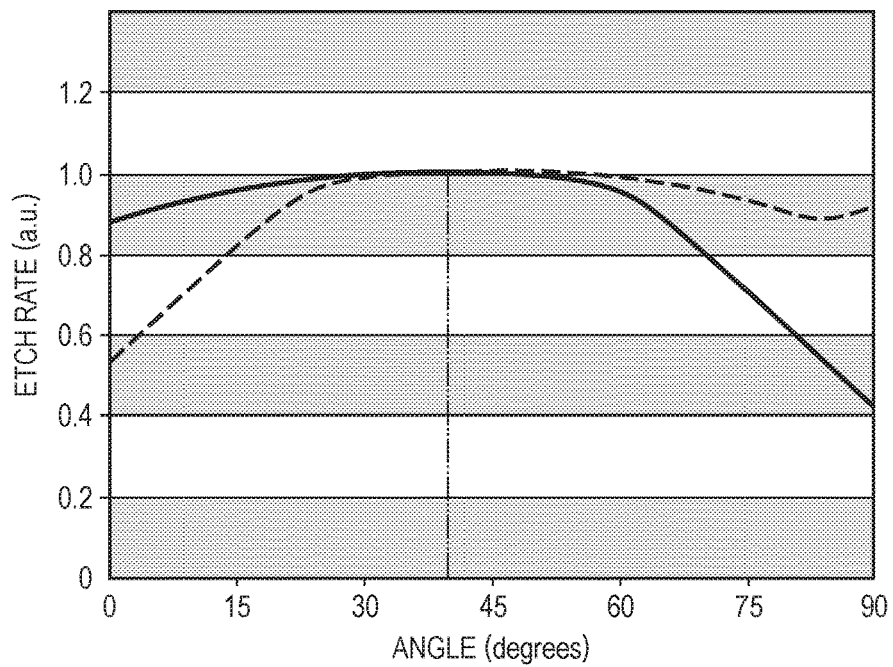
FIG. 9 is a graph (No. 2) for explaining a relationship between an etch rate and an incident angle of Ar particles.

Here, it should be noted that the actual side walls of the separated TMR elements are not perpendicular to the substrate surface to be processed, but slightly tilt. In general, the side walls of the TMR elements manufactured through a desirable etching process tilt at about 10 degrees from the direction perpendicular to the surface to be processed. FIG. 9 presents a relationship between an etch rate and an incident angle of Ar particles in the case where the aforementioned tilt is taken into account. In FIG. 9, a solid line indicates a relationship between the etch rate and the incident angle of Ar particles on a substance having a surface in parallel to the substrate surface to be processed as in FIG. 8. Meanwhile, a broken line indicates a relationship between the etch rate and the incident angle of Ar particles on a surface tilting at 10 degrees from the direction perpendicular to the substrate surface to be processed.

As compared with FIG. 8, it can be seen in FIG. 9 that the broken line is slightly shifted toward the 0-degree side from the 90-degree side of the incident angle of Ar particles. As a result, in FIG. 9, the relationship between the etch rates on the two surfaces is reversed at around approximately 40 degrees. Accordingly, it is preferable to make Ar particles incident at an angel of 40 degrees or larger from the direction perpendicular to the surface to be processed, in order to efficiently etch the side walls of TMR elements while reducing an etching amount of the surface in parallel to the surface to be processed (that is, the electrode layer and the like formed at the bottom of the TMR elements).

Here, the incident angle of Ar particles can be defined by a relationship between the extraction electrode 509 and the substrate mount surface of the ESC electrode 512. To be more specific, in the case where the extraction electrode 509 and the substrate mount surface of the ESC electrode 512 are parallel to each other, the incidence of most of the Ar particles on the surface to be processed is made in the direction perpendicular to the surface to be processed of the substrate mounted on the ESC electrode 512. Thus, in the above case, the Ar incident angle can be defined as 0 degrees.

Here, returning to FIG. 7E, the step of FIG. 7E and the following step in this embodiment are described.

Figure 7E:
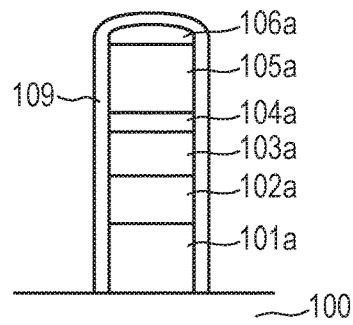
FIG. 7E is a cross sectional process chart (No. 5) for explaining the method of manufacturing a magnetoresistive element according to the embodiment of the present invention.

After completion of the Ar ion beam irradiation, the gas is immediately switched, and the oxygen gas is introduced into the process chamber 304. In this way, an oxide layer 109 is formed on the surface of the magnetic body (FIG. 7E). The layer thickness of the oxide layer 109 may be, for example, about 2 nm. In general, with the simple introduction of the oxygen gas, the oxidation progress hardly progresses at a room temperature (15° C. to 35° C.). However, since the bared surface of the magnetic body processed by the Ar ion beams is a chemically active surface, the oxidation tends to progress easily.

Subsequently, the substrate on which the oxide layers 109 are formed on the surfaces of the magnetic bodies is unloaded from the process chamber 304 and loaded to the protection layer formation chamber 305 by the substrate transfer means provided to the vacuum transfer chamber 302. Then, inside the protection layer formation chamber 305, a protection layer 110 made of a silicon nitride film is formed by the CVD technique, for example, on the substrate having the oxide layers 109 formed thereon. Here, the protection layer 110 is not limited to the silicon nitride film, but may be an aluminum nitride film, a silicon oxynitride film, or the like.

Figure 7F:
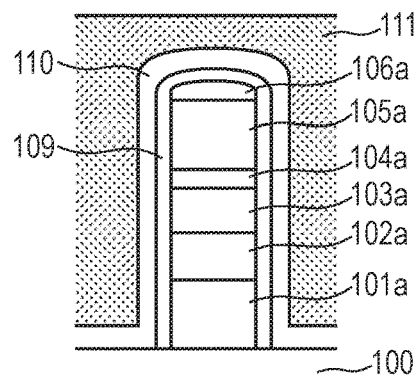
FIG. 7F is a cross sectional process chart (No. 6) for explaining the method of manufacturing a magnetoresistive element according to the embodiment of the present invention.

Next, an interlayer insulating film 111 made of a silicon oxide film is formed by the CVD technique, for example, on the substrate having the protection layer 110 formed thereon (FIG. 7F). Here, the interlayer insulating film 111 is not limited to the silicon oxide film, but any of various insulating films may be used.

In the conventional method, after removal of deposits on the side walls of the TMR elements, the substrate without any additional process performed thereon is unloaded to the vacuum transfer chamber, and is transferred to the protection layer formation chamber. In general, in a substrate process system of a cluster type as illustrated in FIG. 3, a degree of vacuum in the vacuum transfer chamber is lower than that of the process chamber. For this reason, there has been a problem in that the clean surfaces of the side walls of TMR elements are contaminated by impurities such as water. Not only does such adhesion of impurities degrade the element properties, but also the adhesion increases property variation among substrates, accordingly lowing the yield. In contrast to this, in this embodiment, after the adhered substances are removed from the side walls of TMR elements, the oxide layers are formed on the surfaces of the elements without the substrate unloaded to the vacuum transfer chamber. Thus, even if impurities adhere in the vacuum transfer chamber, the element properties can be inhibited from degrading.

Figure 10:
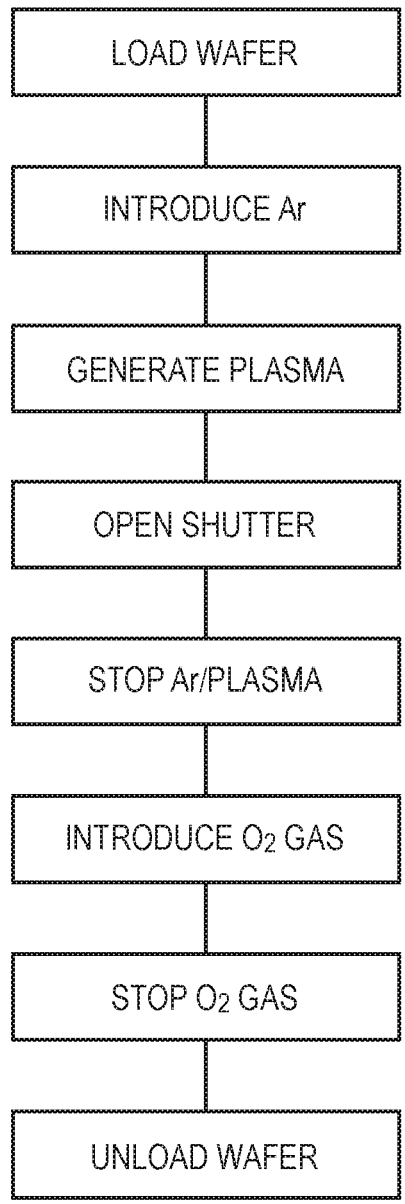
FIG. 10 is a diagram for explaining a sequence in the method of manufacturing a magnetoresistive element according to the embodiment of the present invention.

FIG. 10 presents a sequence provided to the IBE apparatus in this embodiment.

First, a sample (FIG. 7C) obtained by etching a substrate (wafer) on which a multilayer film is formed is loaded to and set in the process chamber where the Ar ion beam irradiation and the oxidation process are to be performed.

Then, after the Ar gas is introduced to the process chamber, the plasma is generated and thereby the sample is irradiated with the Ar ion beams at a certain fixed angle. In this process, the acceleration energy of the Ar ions may be set to, for example, 200 eV. The deposit removal effect is considered to be approximately unchanged in a range of eV to 500 eV is considered to be nearly equal. In particular, the acceleration energy of 20 eV to 200 eV or less is preferable in order to inhibit the ion beams from damaging the stacked films.

After the Ar ion beam irradiation for a time required to remove the deposits, the Ar gas supply and the plasma generation are stopped, and then immediately the process chamber is filled with the oxygen gas. The introduction of the oxygen gas is performed within 30 seconds, for example, from the stoppage of the Ar gas supply and the termination of the plasma generation. Such quick introduction of the oxygen gas within a short period of time after the stoppage of the Ar gas supply and so forth enables reliable formation of the oxide layers.

Figure 11:
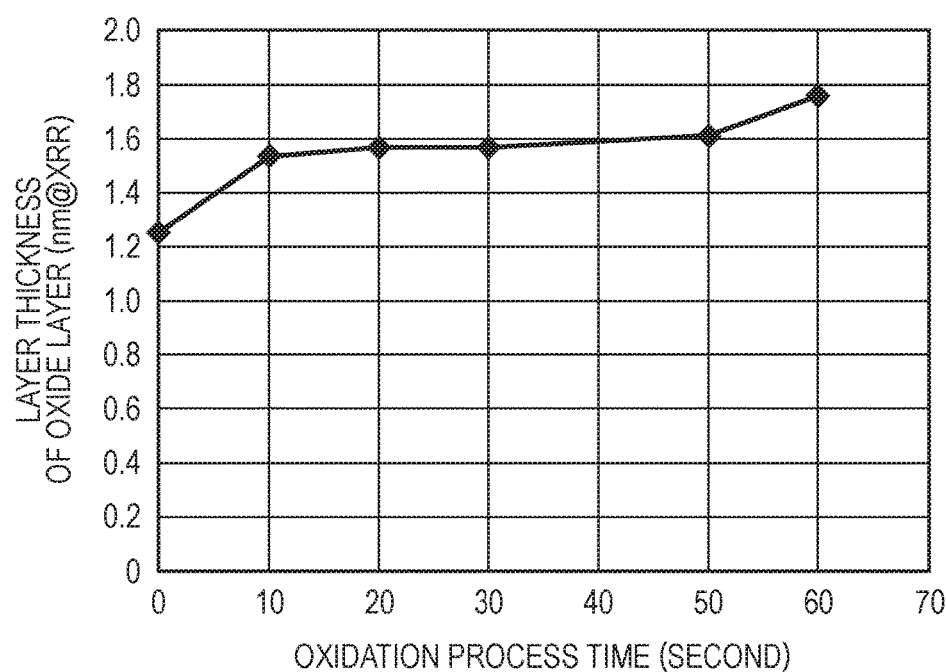
FIG. 11 is a graph presenting a relationship between an oxidation process time and a layer thickness of an oxide layer.

An oxidation process time for performing the oxidation process with the oxygen gas can be determined depending on the required layer thickness of an oxide layer as illustrated in FIG. 11. FIG. 11 is a graph presenting a relationship between the oxidation process time and the layer thickness of the oxide layer, in which the abscissa axis indicates the oxidation process time, and the ordinate axis indicates the layer thickness of the oxide layer. Here, the layer thickness of the oxide layer was measured by X-way reflectivity measurement.

Note that, in the oxidation step using the oxygen gas, it is also possible to introduce the oxygen gas together with an inert gas of Ar, Xe, or the like for the purpose of changing the partial pressure of the oxygen. In addition, any of operations of heating and cooling the sample stage, generating plasma, and so forth may be performed for the purpose of increasing or decreasing the layer thickness of the oxide layer.

Upon end of the required oxidation process time, the supply of the oxygen gas to the process chamber is stopped and the sample is unloaded to the outside of the process chamber.

It is to be noted that the present invention should not be limited to the foregoing embodiment, but may be modified variously.

For example, the above embodiment is described for the case where the oxygen gas is introduced to the chamber where the side portions of multiple stacked films are just irradiated with the ion beams, and thereby the oxide layers are formed on the surfaces of the multiple stacked films. In this regard, the gas to be introduced is not limited to the oxygen gas. As the gas to be introduced, any gas containing oxygen can be used. Besides the oxygen gas, an oxidizing gas such as a dinitrogen monoxide ($N_2O$) gas, a nitrogen dioxide ($NO_2$) gas, an ozone ($O_3$) gas, or a water vapor ($H_2O$) gas may be used. In addition, a mixed gas of them may be used. Further, an inert gas such as an argon gas may be introduced together with the oxidizing gas. Such oxidizing gas may be set to have a partial pressure within the same range as the aforementioned range of the oxygen gas.

Moreover, the above embodiment is described for the case where the oxide layers are formed on the surfaces of the multiple stacked films. Instead of the oxide layers, nitride layers may be formed. In this case, nitride layers may be formed on the surfaces of the multiple stacked films through a nitridation process by introducing a nitriding gas, instead of the oxidizing gas, to the process chamber after the ion beam irradiation. As the nitriding gas, a nitrogen gas, an ammonia ($NH_3$) gas, or the like may be used. Or, a mixed gas of them may be used. Further, an inert gas such as an argon gas may be introduced together with the nitriding gas.

In the case where the nitride layers are formed through the nitridation process using the nitriding gas such as the nitrogen gas, a preferable partial pressure of the nitriding gas is within a range of $1.0 \times 10^{-1}$ Pa to $2.0 \times 10^{-3}$ Pa for the same reasons as described for the oxygen gas. In addition, a preferable layer thickness of the nitride layer is within a range of 1.5 nm to 3.0 nm for the same reasons as described for the oxide layer.

The invention claimed is:

1. A method of manufacturing a magnetoresistive element in which a tunnel barrier layer is provided between two magnetic layers, the method comprising the steps of:
   preparing a stacked film on a substrate, the stacked film including one of the two magnetic layers, a layer to form the tunnel barrier layer, and the other of the two magnetic layers;
   forming a plurality of separated stacked films on the substrate by separating the stacked film by etching;
   irradiating side portions of the plurality of separated stacked films with ion beams in a pressure-reducible process chamber; and
   after the irradiating with the ion beams, without unloading the substrate to an outside of the pressure-reducible process chamber, oxidizing or nitriding surfaces of the plurality of stacked films by introducing an oxidizing gas or a nitriding gas into the pressure-reducible process chamber.

2. The method according to claim 1, wherein the etching is reactive ion etching.

3. The method according to claim 1, wherein the etching is performed by irradiation with the ion beams.

4. The method according to claim 1, wherein the oxidizing gas or the nitriding gas is set at a partial pressure of $1.0 \times 10^{-1}$ Pa to $2.0 \times 10^{-3}$ Pa.

5. The method according to claim 1, wherein oxide layers or nitride layers, each having a layer thickness of 1.5 nm to 3.0 nm, are formed by the oxidizing or the nitriding of the surfaces of the plurality of stacked films.

6. The method according to claim 1, wherein oxide layers or nitride layers are formed by the oxidizing or the nitriding of the surfaces of the plurality of stacked films, and
   wherein the method further comprises a step of forming a protection layer on the oxide layers or the nitride layers.

7. The method according to claim 6, wherein the protection layer is a nitride film.

8. The method according to claim 1, wherein the layer to form the tunnel barrier layer contains $Al_2O_3$ or MgO.

9. The method according to claim 1, wherein the irradiating with the ion beams comprises generating plasma by using an inert gas.

10. The method according to claim 9, wherein the oxidizing gas or the nitriding gas is introduced together with the inert gas.

11. The method according to claim 9, wherein the oxidizing gas or the nitriding gas is introduced after completion of the generating of the plasma.

12. A method of manufacturing a magnetoresistive element in which a tunnel barrier layer is provided between two magnetic layers, the method comprising the steps of:
- preparing a stacked film on a substrate, the stacked film including one of the two magnetic layers, a layer to form the tunnel barrier layer, and the other of the two magnetic layers;
- forming a plurality of separated stacked films on the substrate by separating the stacked film by etching;
- irradiating side portions of the plurality of separated stacked films with ion beams extracted from plasma of an inert gas in a pressure-reducible process chamber to perform a trimming process to trim the side portions of the plurality of separated stacked films to provide a plurality of trimmed stacked films; and
- in succession to the trimming process, forming oxide layers or nitride layers on surfaces of the plurality of trimmed stacked films by introducing an oxidizing gas or a nitriding gas into the pressure-reducible process chamber.

* * * * *